(12) United States Patent
Wind et al.

(10) Patent No.: US 11,989,988 B2
(45) Date of Patent: May 21, 2024

(54) ELECTRONIC LOCK WITH PHOTOVOLTAIC CELLS

(71) Applicant: ZEPHYR LOCK, LLC, Newtown, CT (US)

(72) Inventors: Patrick E. Wind, Darien, CT (US); Timothy Marshall, Wolcott, CT (US)

(73) Assignee: ZEPHYR LOCK, LLC, Newtown, CT (US)

( * ) Notice: Subject to any disclaimer, the term of this patent is extended or adjusted under 35 U.S.C. 154(b) by 185 days.

(21) Appl. No.: 17/504,103

(22) Filed: Oct. 18, 2021

(65) Prior Publication Data

US 2022/0122392 A1     Apr. 21, 2022

Related U.S. Application Data

(60) Provisional application No. 63/242,947, filed on Sep. 10, 2021, provisional application No. 63/093,600, filed on Oct. 19, 2020.

(51) Int. Cl.
| | |
|---|---|
| *G07C 9/00* | (2020.01) |
| *H01L 31/0445* | (2014.01) |
| *H02S 40/38* | (2014.01) |
| *E05B 41/00* | (2006.01) |
| *E05B 47/00* | (2006.01) |

(52) U.S. Cl.
CPC ...... *G07C 9/00674* (2013.01); *H01L 31/0445* (2014.12); *H02S 40/38* (2014.12); *E05B 41/00* (2013.01); *E05B 47/0001* (2013.01); *E05B 2047/0058* (2013.01); *E05B 2047/0064* (2013.01); *G07C 2009/00642* (2013.01)

(58) Field of Classification Search
CPC ...... G07C 9/00674; G07C 2009/00642; H01L 31/0445; H02S 40/38; E05B 41/00; E05B 47/0001; E05B 2047/0058; E05B 2047/0064

See application file for complete search history.

(56) References Cited

U.S. PATENT DOCUMENTS

| | | | |
|---|---|---|---|
| 5,009,456 A | 4/1991 | Eck | |
| 9,127,477 B1 * | 9/2015 | Yang | ........................ E05B 5/00 |
| 9,830,759 B2 | 11/2017 | Hilton et al. | |
| 10,508,474 B2 | 12/2019 | Wyatt | |
| 10,881,234 B2 | 1/2021 | Roberts | |
| 2007/0240464 A1 * | 10/2007 | Miller | ................. E05B 47/0673 |
| | | | 340/5.64 |

(Continued)

FOREIGN PATENT DOCUMENTS

| | | |
|---|---|---|
| CN | 200996229 Y | 12/2007 |
| CN | 206524669 U | 9/2017 |

(Continued)

OTHER PUBLICATIONS

Final Office Action Dec. 4, 2023.
Non-Final Office Action dated Jun. 16, 2023.

*Primary Examiner* — Mark A Williams
(74) *Attorney, Agent, or Firm* — CANTOR COLBURN LLP

(57) ABSTRACT

An electronic lock, including: a power storage device; and photovoltaic cells located on a surface of the electronic lock, the photovoltaic cells being electrically coupled to the power storage device in order to provide a charging current to the power storage device.

20 Claims, 12 Drawing Sheets

Graphics on solar panel multi button

(56) References Cited

U.S. PATENT DOCUMENTS

| | | |
|---|---|---|
| 2008/0041445 A1 | 2/2008 | Miller et al. |
| 2010/0198551 A1 | 8/2010 | Schmidt et al. |
| 2013/0239629 A1* | 9/2013 | Choy ................ E05B 37/08 |
| | | 70/315 |
| 2013/0283866 A1* | 10/2013 | Houlihan ............ E05B 13/04 |
| | | 70/286 |
| 2014/0340032 A1 | 11/2014 | Curtis |
| 2015/0107316 A1 | 4/2015 | Kirkjan |
| 2016/0353548 A1 | 12/2016 | Davis |
| 2017/0002586 A1* | 1/2017 | Lee ..................... E05B 39/00 |
| 2017/0191287 A1* | 7/2017 | Mittleman ............ E05B 41/00 |
| 2017/0278880 A1* | 9/2017 | Bryla ................... H02J 7/0068 |
| 2018/0033311 A1* | 2/2018 | Berggren .............. G01S 19/01 |
| 2018/0160835 A1 | 6/2018 | Garrity et al. |
| 2018/0216364 A1* | 8/2018 | Wind .................. E05B 1/0007 |
| 2019/0100940 A1 | 4/2019 | Imanuel et al. |
| 2019/0118765 A1* | 4/2019 | House ................... G04B 47/00 |
| 2020/0141157 A1 | 5/2020 | Miller et al. |
| 2020/0143616 A1 | 5/2020 | Ma et al. |
| 2020/0327757 A1* | 10/2020 | Kelley ................ G07C 9/00309 |
| 2021/0159470 A1* | 5/2021 | Duggan ............... H01M 4/131 |
| 2022/0345219 A1 | 10/2022 | Apetrei |
| 2023/0081071 A1* | 3/2023 | Wind .................... H02J 50/005 |
| | | 307/104 |

FOREIGN PATENT DOCUMENTS

| | | |
|---|---|---|
| CN | 108374608 A | 8/2018 |
| DE | 29502019 U1 | 4/1995 |
| DE | 202012101008 U1 | 5/2012 |
| FR | 2965838 A1 | 4/2012 |
| JP | 2004225422 A | 8/2004 |
| KR | 101087277 B1 | 11/2011 |
| LU | 100006 B1 | 6/2017 |
| WO | 2009110893 A1 | 9/2009 |

* cited by examiner

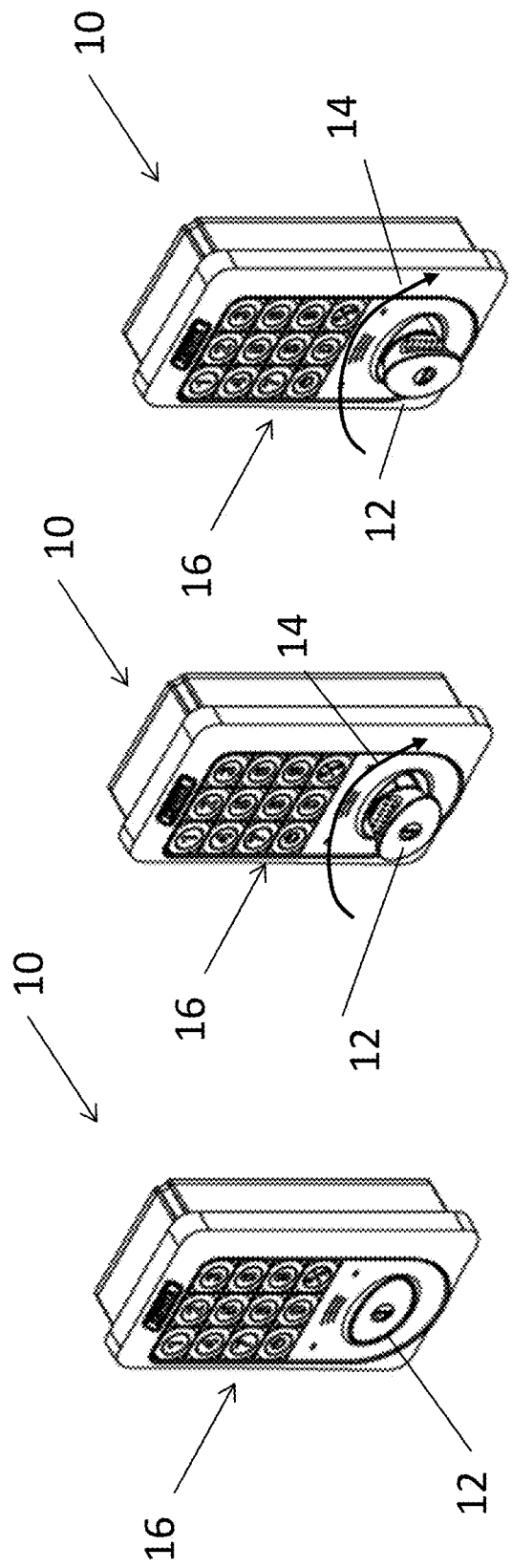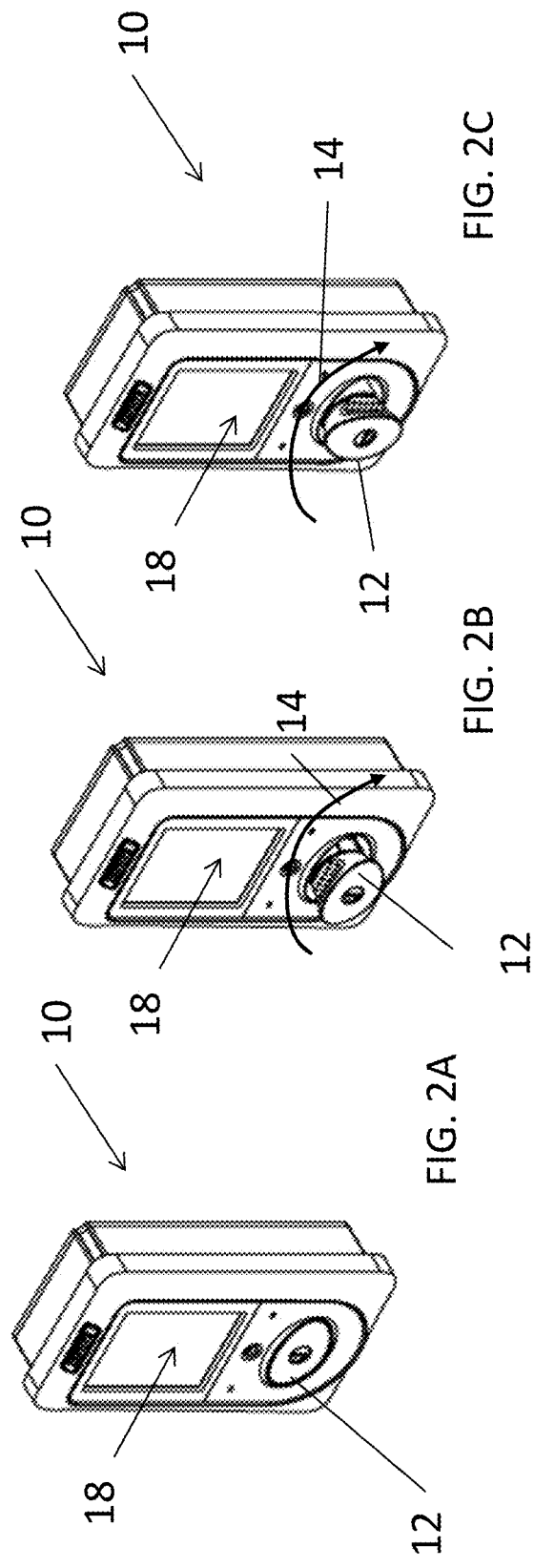

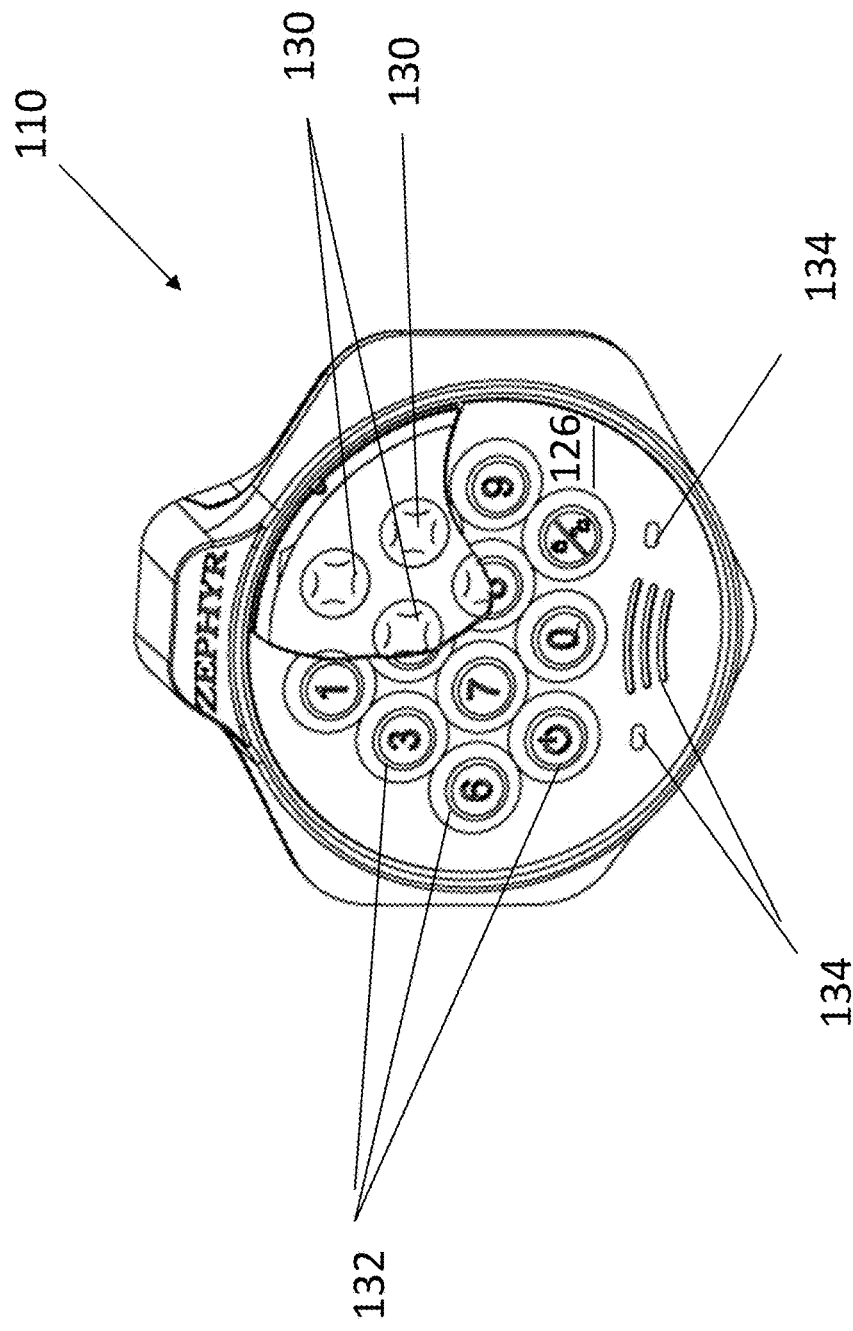

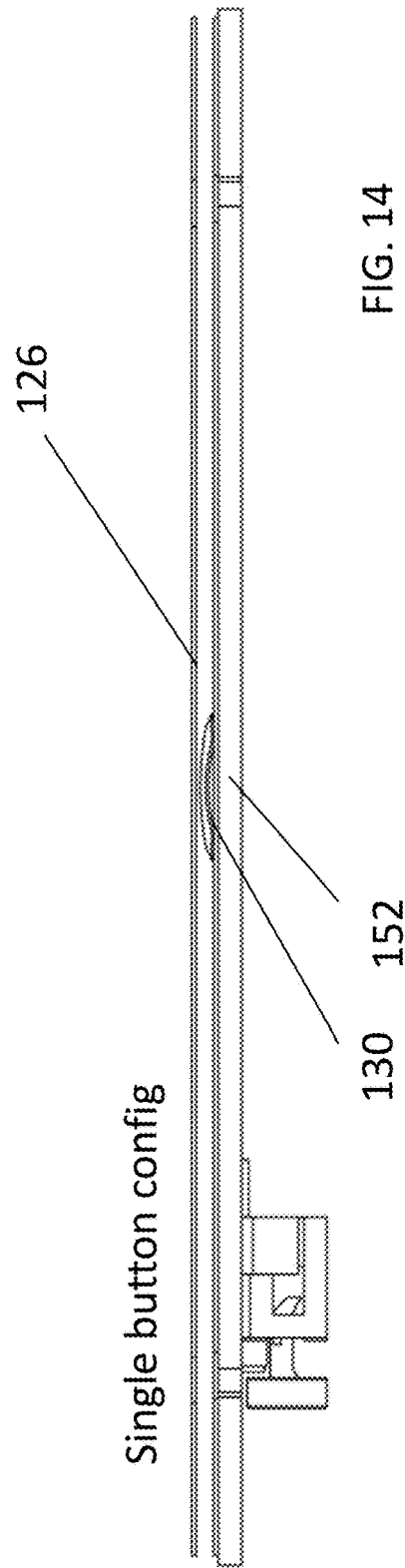
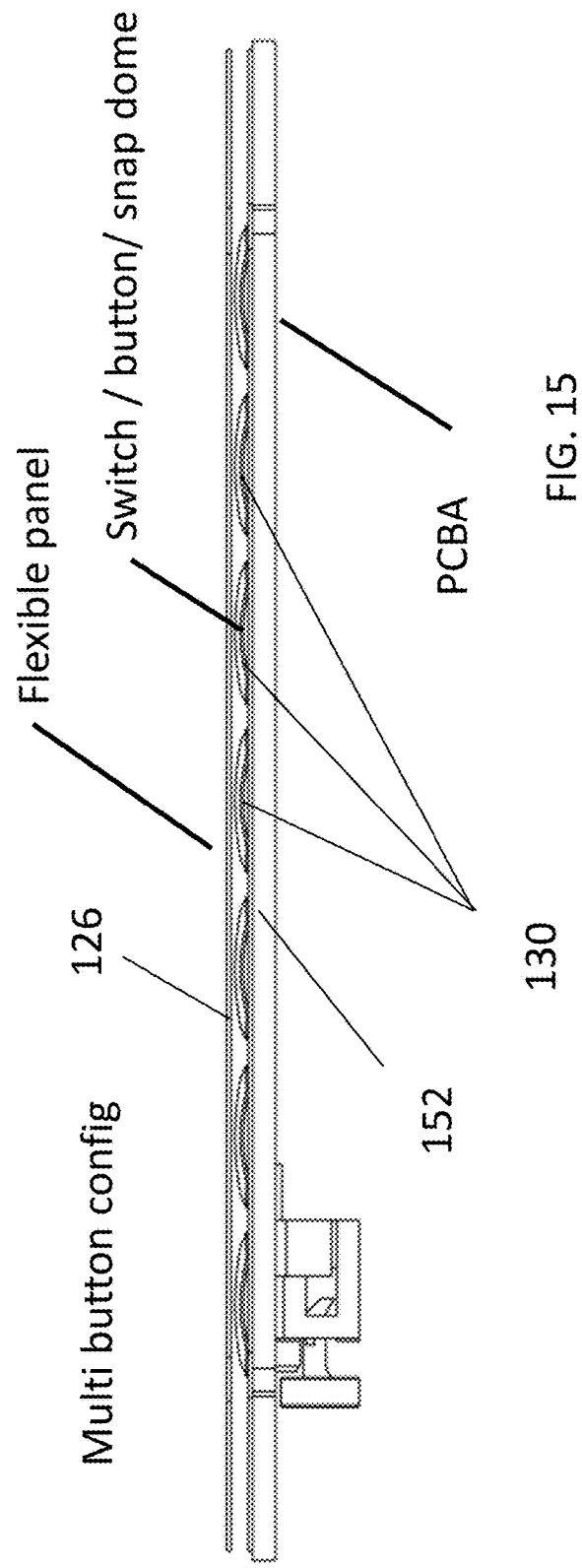

ELECTRONIC LOCK WITH PHOTOVOLTAIC CELLS

CROSS REFERENCE TO RELATED APPLICATIONS

This application claims the benefit of U.S. Provisional Patent Application No. 63/093,600 filed on Oct. 19, 2020, the entire contents of which are incorporated herein by reference thereto.

This application claims the benefit of U.S. Provisional Patent Application No. 63/242,947 filed on Sep. 10, 2021, the entire contents of which are incorporated herein by reference thereto.

BACKGROUND

Exemplary embodiments of the present disclosure relate generally to electronic locks that require a source of power.

Locks are used to secure or lock the door of lockers, cabinets, toolboxes, desks, access doors, drawers and other such enclosures. In some applications and where an electronic lock is used a power source is required to operate electrical components (e.g., keypad, motor, solenoid, radio frequency identification (RFID). Typically, this is provided by a battery or capacitor which over time will degrade or discharge and have to be replaced or recharged.

Accordingly, it is desirable to provide an electronic lock with a means for providing an extended battery life or method to recharge a capacitor or other electrical storage device.

BRIEF DESCRIPTION

Disclosed is an electronic lock, including: a power storage device; and photovoltaic cells located on a surface of the electronic lock, the photovoltaic cells being electrically coupled to the power storage device in order to provide a charging current to the power storage device.

In addition to one or more of the features described above, or as an alternative to any of the foregoing embodiments, the power storage device is a rechargeable battery or capacitor.

Also disclosed is an electronic lock, including: a power storage device; photovoltaic cells located on a surface of the electronic lock, the photovoltaic cells being electrically coupled to the power storage device in order to provide a charging current to the power storage device; and at least one button located behind the photovoltaic cells such that when the photovoltaic cells are depressed then the at least one button is actuated.

In addition to one or more of the features described above, or as an alternative to any of the foregoing embodiments, the power storage device is a rechargeable battery or capacitor.

In addition to one or more of the features described above, or as an alternative to any of the foregoing embodiments, the photovoltaic cells is a rigid sheet of photovoltaic cells.

In addition to one or more of the features described above, or as an alternative to any of the foregoing embodiments, the photovoltaic cells is a flexible sheet of photovoltaic cells.

In addition to one or more of the features described above, or as an alternative to any of the foregoing embodiments, the at least one button is a plurality of buttons.

In addition to one or more of the features described above, or as an alternative to any of the foregoing embodiments, the at least one button is a single button.

In addition to one or more of the features described above, or as an alternative to any of the foregoing embodiments, the photovoltaic cells is a rigid sheet of photovoltaic cells with indicia located on a surface of the sheet of photovoltaic cells, the indicia being located over the at least one button.

In addition to one or more of the features described above, or as an alternative to any of the foregoing embodiments, the photovoltaic cells is a flexible sheet of photovoltaic cells with indicia located on a surface of the sheet of photovoltaic cells, the indicia being located over the at least one button.

In addition to one or more of the features described above, or as an alternative to any of the foregoing embodiments, a motor is operably coupled to a bolt of the electronic lock and the motor is energized via wireless communication with a device that communicates wirelessly with a receiver or receiver/transmitter in operable communication with a microprocessor, wherein when the device is within range of the receiver or receiver/transmitter a transmitter of the device provides an actuation code to the motor and the motor is actuated in order to retract the bolt in order to allow for the lock to open.

In addition to one or more of the features described above, or as an alternative to any of the foregoing embodiments, the electronic lock is in a sleep mode where the receiver/transmitter is not activated until the at least one button located behind the photovoltaic cells is depressed.

In addition to one or more of the features described above, or as an alternative to any of the foregoing embodiments, the indicia is a circle or a number.

In addition to one or more of the features described above, or as an alternative to any of the foregoing embodiments, an indicator light is provided that illuminates when the electronic lock is activated.

In addition to one or more of the features described above, or as an alternative to any of the foregoing embodiments, no indicia is provided on the photovoltaic cells.

In addition to one or more of the features described above, or as an alternative to any of the foregoing embodiments, the at least one button is a plurality of buttons for entering a combination.

In addition to one or more of the features described above, or as an alternative to any of the foregoing embodiments, a flange surrounds a portion of the electronic lock and the photovoltaic cells are applied to the flange.

In addition to one or more of the features described above, or as an alternative to any of the foregoing embodiments, an indicator light is provided that illuminates when the electronic lock is activated.

In addition to one or more of the features described above, or as an alternative to any of the foregoing embodiments, no indicia is provided on the photovoltaic cells.

In addition to one or more of the features described above, or as an alternative to any of the foregoing embodiments, the power storage device is a rechargeable battery or capacitor.

In addition to one or more of the features described above, or as an alternative to any of the foregoing embodiments, the photovoltaic cells is a rigid sheet of photovoltaic cells with indicia located on a surface of the sheet of photovoltaic cells, the indicia being located over the at least one button.

BRIEF DESCRIPTION OF THE DRAWINGS

The following descriptions should not be considered limiting in any way. With reference to the accompanying drawings, like elements are numbered alike:

FIG. 1A is a perspective view of a lock according to one embodiment in a first position;

FIG. 1B is a perspective view of the lock of FIG. 1A in a second position;

FIG. 1C is a perspective view of the lock of FIG. 1A in a third position;

FIG. 2A is a perspective view of a lock according to another embodiment in a first position;

FIG. 2B is a perspective view of the lock of FIG. 2A in a second position;

FIG. 2C is a perspective view of the lock of FIG. 2A in a third position;

FIG. 12 is a perspective view of the lock illustrated with a portion of the photovoltaic cells removed to illustrate the buttons behind the photovoltaic cells;

FIG. 14 is a cross-sectional view of a portion of a lock according to the present disclosure; and FIG. 15 is a cross-sectional view of a portion of a lock according to the present disclosure.

DETAILED DESCRIPTION

Figure 3:
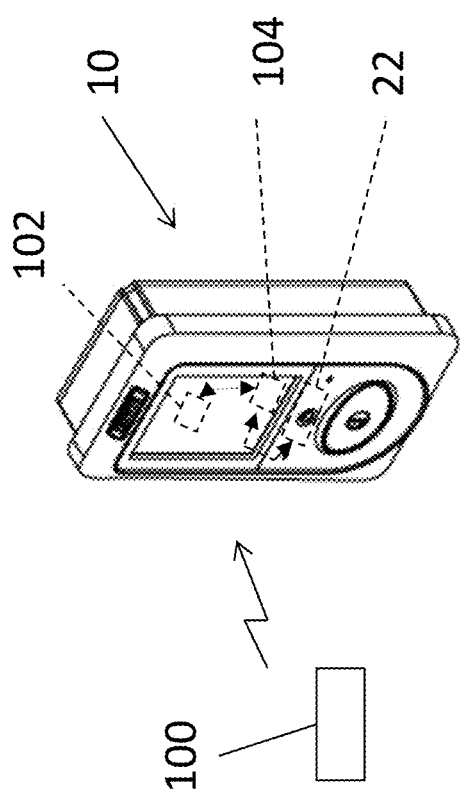
FIG. 3 illustrates an alternative lock of the present disclosure.

A detailed description of one or more embodiments of the disclosed apparatus and method are presented herein by way of exemplification and not limitation with reference to the Figures.

Referring now to FIG. 1A is a perspective view of a lock 10 according to one embodiment of the present disclosure is illustrated in a first position, wherein a retractable knob 12 is shown in a first or retracted position. In FIG. 1B the retractable knob 12 is in a second position or extended position. In FIG. 1C the retractable knob 12 is rotated in the direction of arrow 14 to a rotated or third position from the second position. Rotation of the retractable knob from the second position to the third positon will cause movement of a component secured to the lock 10 which will unlock a latch (not shown). The lock 10 illustrated in FIGS. 1A-1C is operated by a keypad 16.

Referring now to FIG. 2A is a perspective view of a lock 10 according to another embodiment of the present disclosure is illustrated in a first position, wherein the retractable knob 12 is shown in a first or retracted position. In FIG. 2B the retractable knob 12 is in the second position or extended position. In FIG. 2C the retractable knob 12 is rotated in the direction of arrow 14 to the rotated or third position from the second position. Rotation of the retractable knob from the second position to the third positon will cause movement of a component secured to the lock 10 which will unlock a latch (not shown). The lock 10 illustrated in FIGS. 2A-2C is operated by a touch screen 18.

In operation the lock 10 is unlocked by providing the proper combination to the lock 10 via the keypad 16 or touch screen 18. Once this combination is provided a motor is energized and the knob 12 of the lock 10 is released from its first or retracted position so that it can move to its second position and thus be rotated to its third position thereby unlocking the enclosure the lock 10 is associated with.

In another embodiment and as illustrated schematically in FIG. 3, the motor 22 is energized via wireless communication (e.g., Bluetooth, WiFi, RFID, etc. or any other equivalent communication) with a key FOB, wireless key, RFID card or other equivalent device 100 that communicates wirelessly with a receiver or receiver/transmitter 102 in operable communication with a microprocessor 104 or other equivalent device or the receiver/transmitter 102 directly communicates with the motor 22. Accordingly and when the key FOB or other equivalent device 100 is within range of the receiver or receiver/transmitter 102 a transmitter 106 of the key FOB or other equivalent device 100 provides an actuation code to the motor 22 and the motor 22 is actuated in order to allow the knob 12 extend from the lock 10 as described above.

FIGS. 1-5 merely illustrate non-limiting configurations of electronic locks for use with the present disclosure.

Figure 5:
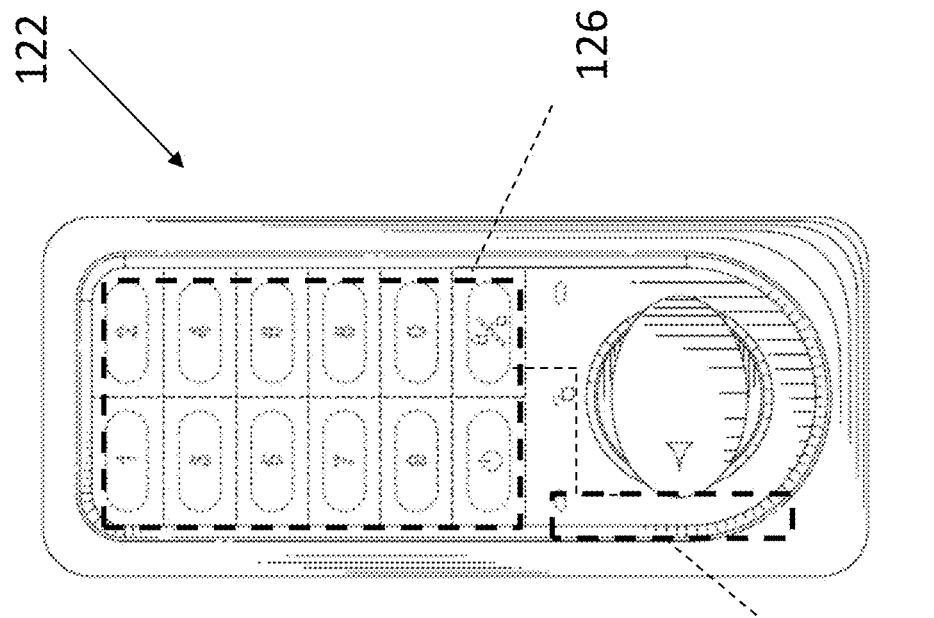
FIGS. 4 and 5 are front views of electronic locks of the present disclosure.
Figure 4:
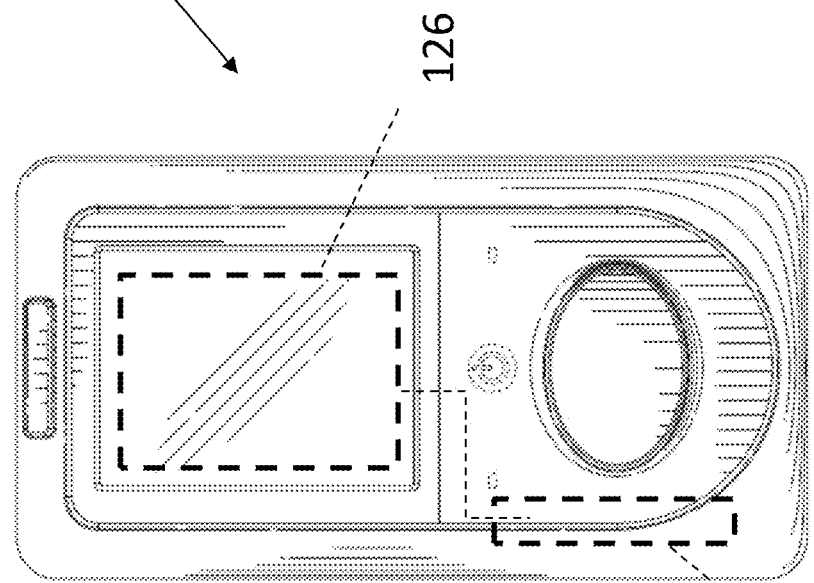

Referring now to FIGS. 4 and 5 a front surface of electronic locks 120, 122 are illustrated. As mentioned above, these electronic locks each have an internal power supply such as a battery, capacitor or power storage device 124 in order to provide the aforementioned functions unlocking and/or deployment of a moveable knob. In accordance with one embodiment of the present disclosure photovoltaic cells (e.g., a solar panel(s)) 126 are incorporated into a front surface of the locks 120, 122. As such, the battery, capacitor or power storage device 124 may be a rechargeable battery or capacitor 124 that is charged by the photovoltaic cells. The photovoltaic cells 126 may be in any location on the surface of the lock as long as it is capable of being exposed to light in order to provide a trickle charge or current to the battery, capacitor or power storage device 124. In one embodiment, the photovoltaic cells 126 may be a layer on or surrounding the keypad. Alternatively, the photovoltaic cells 126 may be located on any surface of the lock. In yet another alternative discrete areas of the lock surface may have photovoltaic cells 126 disposed thereon. In yet another alternative the photovoltaic cells 126 may comprise a flexible sheet applied to the surface of the lock. The flexible sheet may surround and/or cover the buttons of the lock.

It being understood that while certain lock face configurations are illustrated in the attached FIGS, it is understood that the embodiments of the present disclosure are applicable to any lock face configuration or lock configuration and the embodiments of the present disclosure are not limited to the specific configurations illustrated in the attached FIGS.

Figure 6:
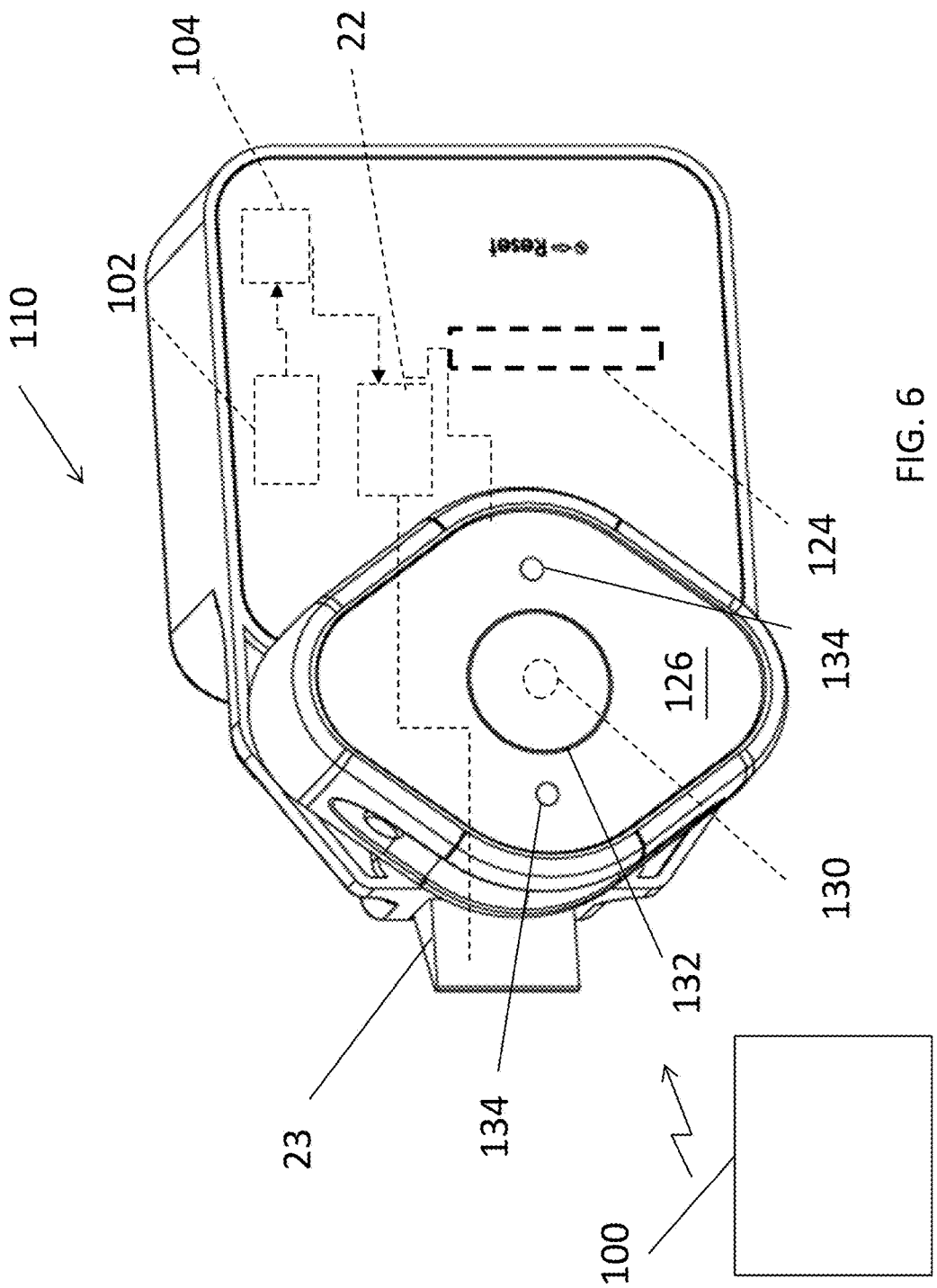
FIG. 6 is a perspective view of a lock according to the present disclosure.

Referring now to FIG. 6 a perspective view of a lock 110 according to the present disclosure is illustrated. In this embodiment, the lock has a sheet or layer of photovoltaic cells (e.g., a solar panel(s)) 126 that covers a face of the lock 110. In the illustrated embodiment, the sheet or layer of photovoltaic cells 126 completely or substantially covers the face of the lock 110. In the addition, the sheet or layer of photovoltaic cells 126 is operably coupled to a battery, capacitor or power storage device 124.

In this embodiment, a motor 22 is operably coupled to a bolt 23 of the lock 110 and the motor 22 is energized via wireless communication (e.g., Bluetooth, WiFi, RFID, etc.

or any other equivalent communication) with a key FOB, wireless key, RFID card, or other equivalent device 100 that communicates wirelessly with a receiver or receiver/transmitter 102 in operable communication with a microprocessor 104 or other equivalent device or the receiver/transmitter 102 directly communicates with the motor 22. Accordingly and when the key FOB or other equivalent device 100 is within range of the receiver or receiver/transmitter 102 a transmitter 106 of the key FOB or other equivalent device 100 provides an actuation code to the motor 22 and the motor 22 is actuated in order to retract the bolt 23 in order to allow for the lock 110 to open.

In this embodiment, the lock 110 is in a sleep mode where the receiver/transmitter 102 is not activated until a button 130 located behind the sheet or layer of photovoltaic cells 126 is depressed. This allows the lock to conserve power as the receiver/transmitter 102 is not constantly on. In this embodiment, the lock 110 may have only one button 130 and no other buttons located behind the sheet or layer of photovoltaic cells (e.g., a solar panel(s)) 126.

In order for a user to know where the button 130 is located indicia 132 is applied to the front surface of the sheet or layer of photovoltaic cells 126 such that it is located above the button 130. In this embodiment, the indicia 132 is a circle. Of course, any other type of indicia 132 is contemplated. Also shown is that the lock 110 has indicator lights or light emitting diodes 134 that illuminate when the lock is activated.

As such and during operation a user holding the key FOB, wireless key, RFID card, or other equivalent device 100 depresses the sheet or layer of photovoltaic cells 126 so that the button 130 is depressed and the receiver/transmitter 102 is activated. Then the key FOB, wireless key, RFID card, or other equivalent device 100 provides an actuation code to the motor 22 and the motor 22 is actuated in order to retract a bolt 128 in order to allow for the lock 110 to open. During this operation the LEDs or lights 134 may be illuminated to indicate the lock 110 is active. Alternatively, the lock 110 may be constructed to not have any LEDs or lights 134 and only the sheet or layer of photovoltaic cells 126 is located on the surface of the lock 110. The sheet or layer of photovoltaic cells 126 may have indicia 132 or may not have any indicia 132. For example and in one embodiment, the sheet or layer of photovoltaic cells 126 may in one non-limiting embodiment not have any indicia 132 and not have any LEDs or lights 134.

In this embodiment, the sheet or layer of photovoltaic cells 126 may be rigid or flexible as long as it can move enough to acuate button 130.

Figure 7:
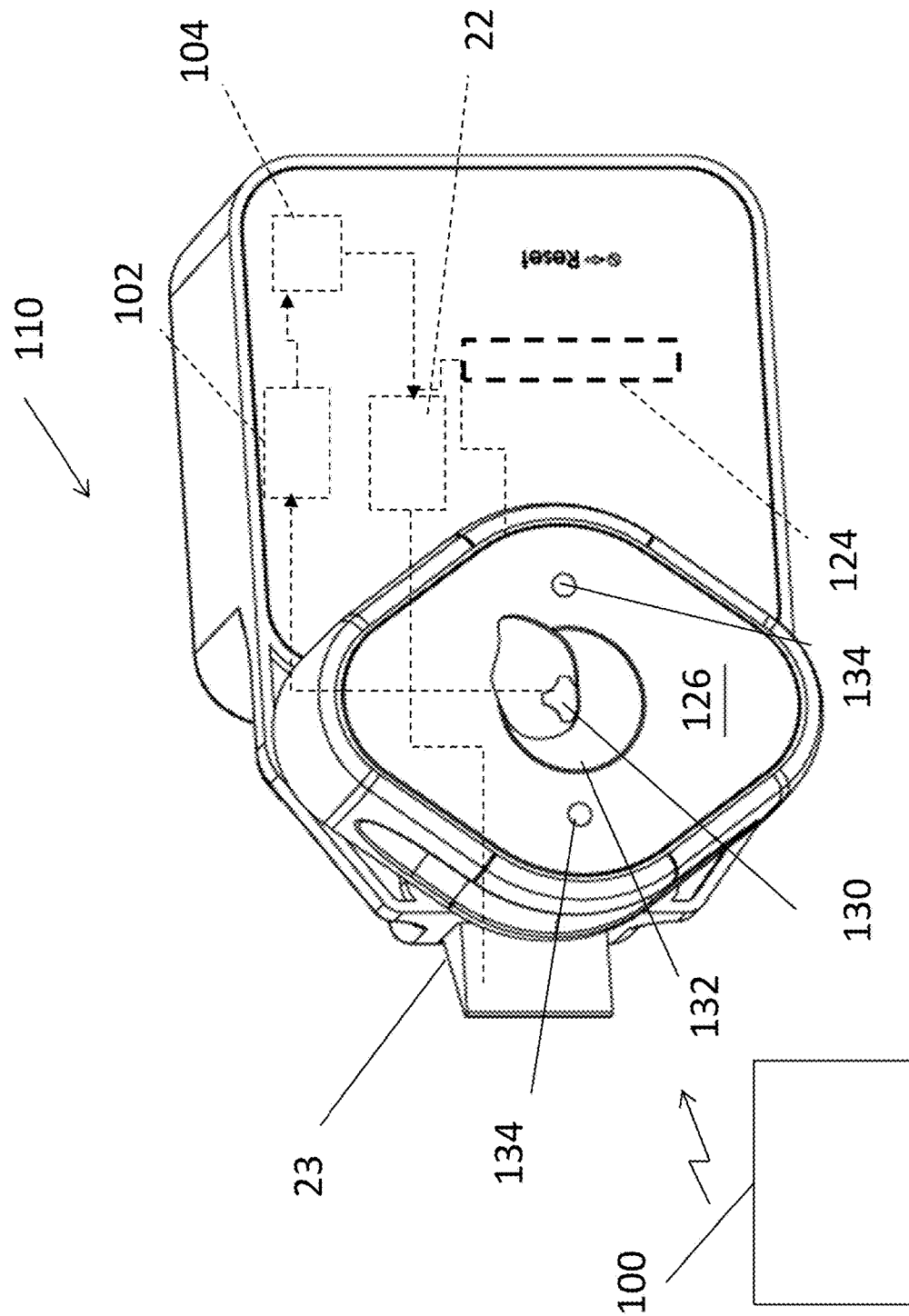
FIG. 7 is a perspective view of the lock illustrated in FIG. 6 with a portion of the photovoltaic cells removed to illustrate the button behind the photovoltaic cells.

FIG. 7 is a perspective view of the lock illustrated in FIG. 6 with a portion of the photovoltaic cells 126 removed to illustrate the button 130 behind the photovoltaic cells.

Figure 8:
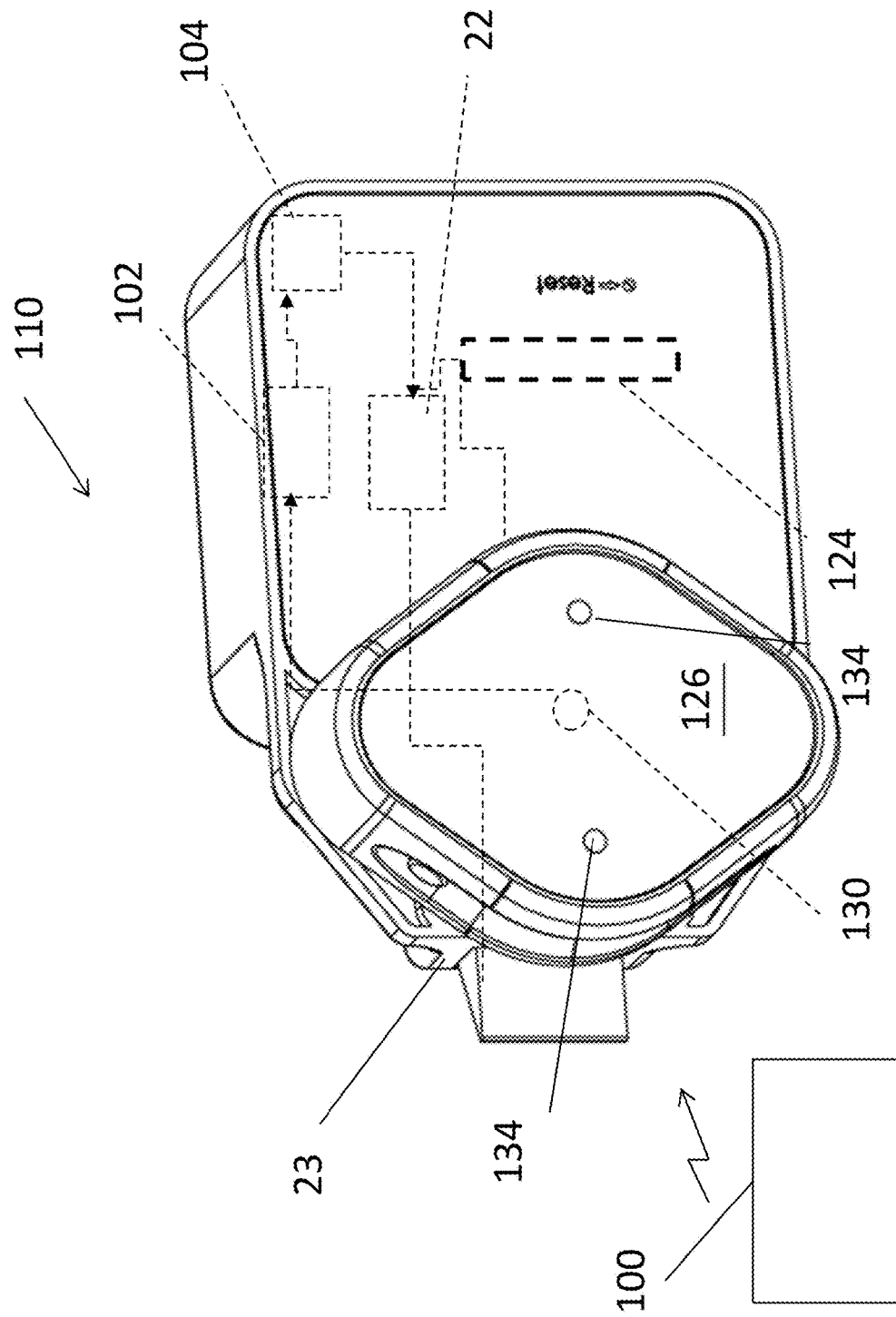
FIG. 8 is a perspective view of a lock according to the present disclosure.

FIG. 8 is a perspective view of the lock illustrated in FIG. 6 without any indicia 134.

Figure 9:
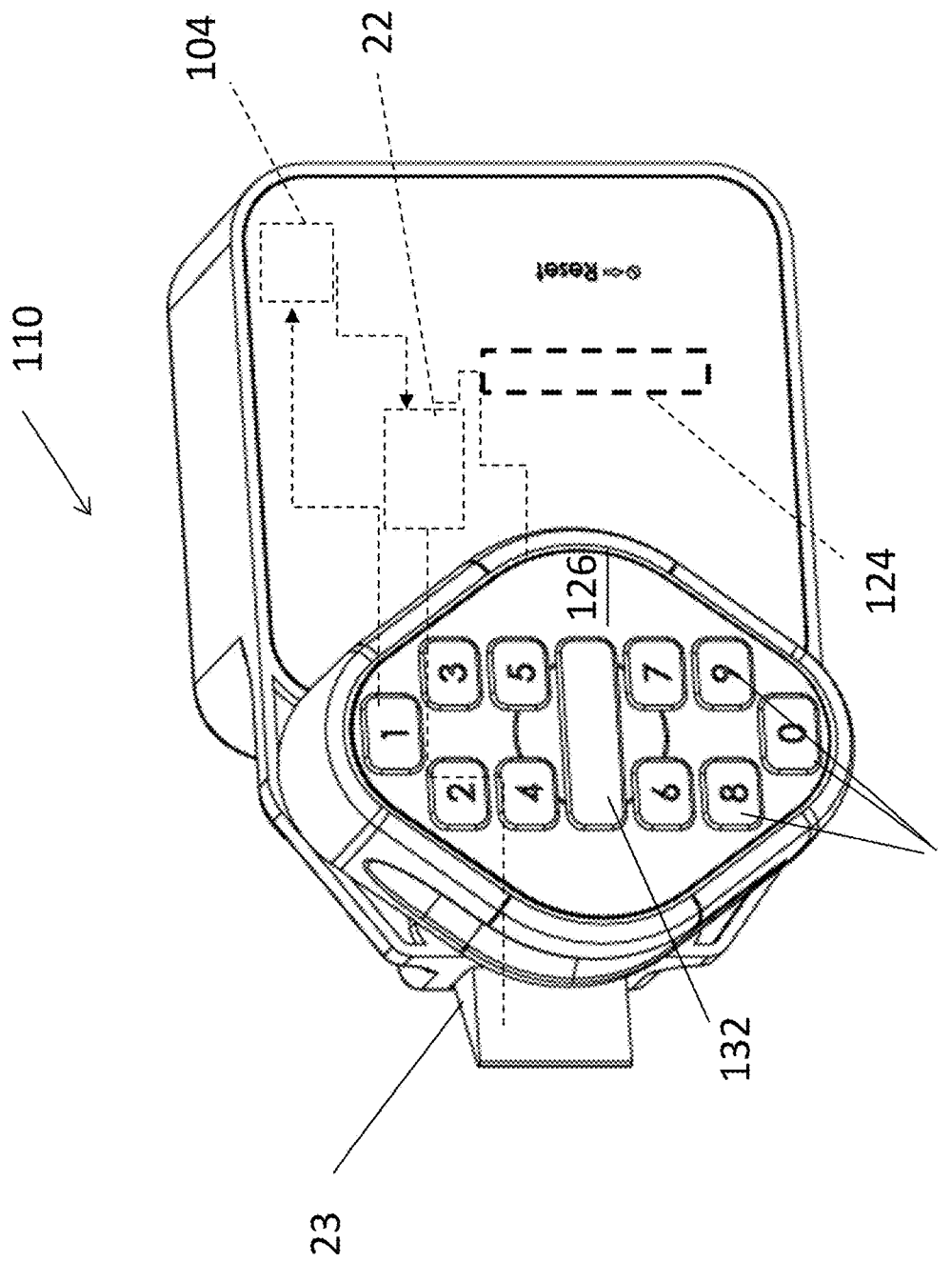
FIG. 9 is a perspective view of a lock according to the present disclosure.

Referring now to FIG. 9 is a perspective view of a lock according to another embodiment of the present disclosure is illustrated. In this embodiment, the motor 22 is operably coupled to a bolt 23 of the lock 110 and the motor 22 is energized via a combination applied by depressing buttons 130 in operable communication with a microprocessor 104 or other equivalent device. Accordingly and when the correct combination is entered via the buttons 130 the motor 22 is actuated in order to retract the bolt 23 in order to allow for the lock 110 to open.

In this embodiment, the lock 110 is in a sleep mode until a button 130 located behind the sheet or layer of photovoltaic cells 126 is depressed. This allows the lock to conserve power. Alternatively, the lock 110 may not be in a sleep mode.

In order for a user to know where the buttons 130 are located indica 132 is applied to the front surface of the sheet or layer of photovoltaic cells 126 such that it is located above the buttons 130. In this embodiment, the indicia 132 numbers 1, 2, 3, 4, 5, 6, 7, 8, 9 and 0 and a centrally located button 130 is located behind indica 132 representing a rectangle. Of course, any other type of indicia 132 is contemplated. The lock of this embodiment may also have indicator lights or light emitting diodes 134 that illuminate when the lock 110 is activated. Alternatively, there may be no indicator lights or light emitting diodes 134 being used. In addition and as an alternative there may be indicia 132 or no indicator lights or light emitting diodes 134 being used. In other words and one alternative non-limiting embodiment, the sheet or layer of photovoltaic cells 126 is devoid of any markings, indicia or lights.

Figure 10:
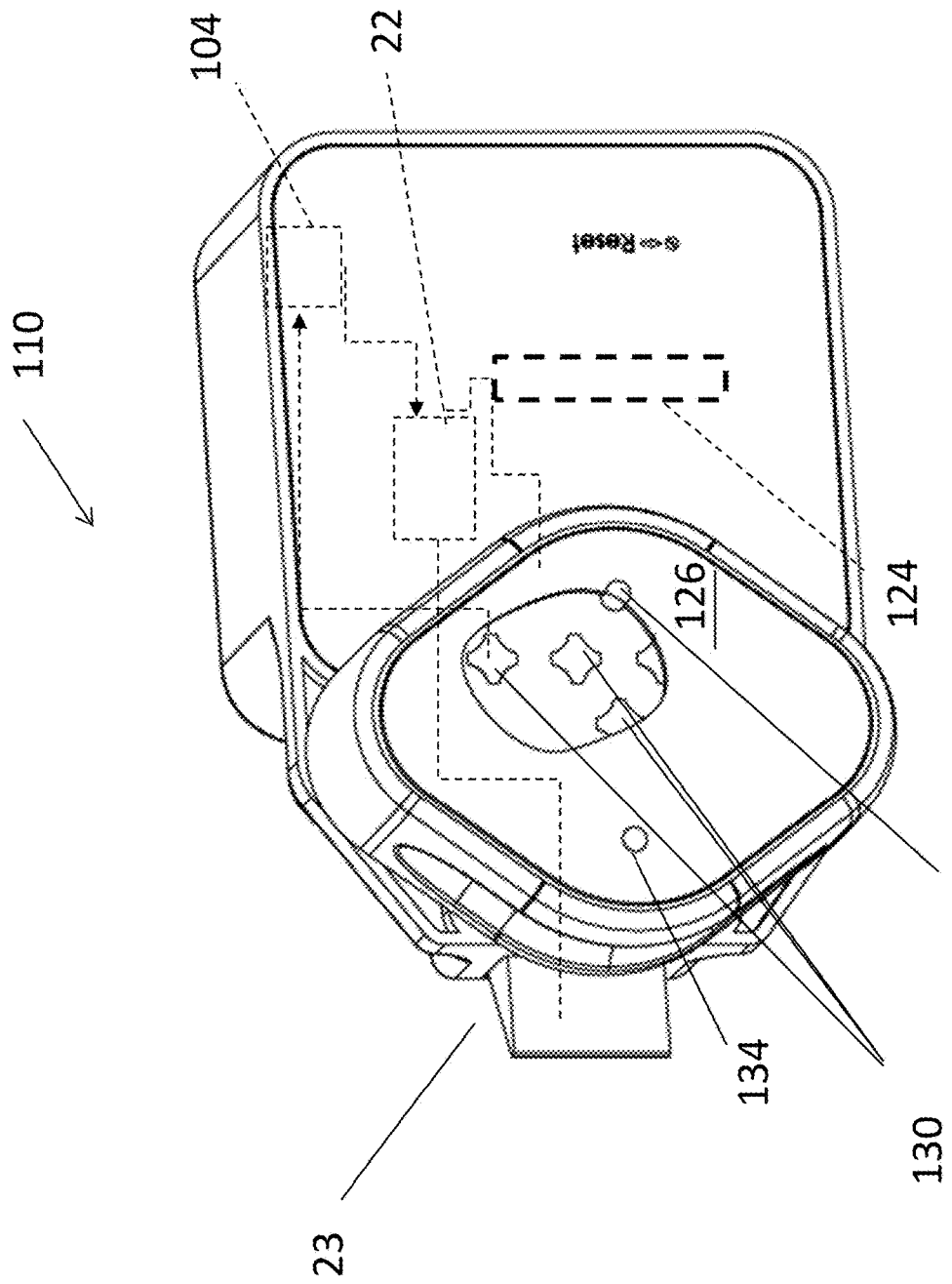
FIG. 10 is a perspective view of the lock illustrated in FIG. 9 with a portion of the photovoltaic cells removed to illustrate the buttons behind the photovoltaic cells.

FIG. 10 is a perspective view of the lock 110 illustrated in FIG. 9 with a portion of the photovoltaic cells removed to illustrate the buttons 130 behind the sheet or layer of photovoltaic cells 126. In this embodiment, the sheet or layer of photovoltaic cells 126 is flexible as it has multiple buttons 130 located behind it.

Figure 11:
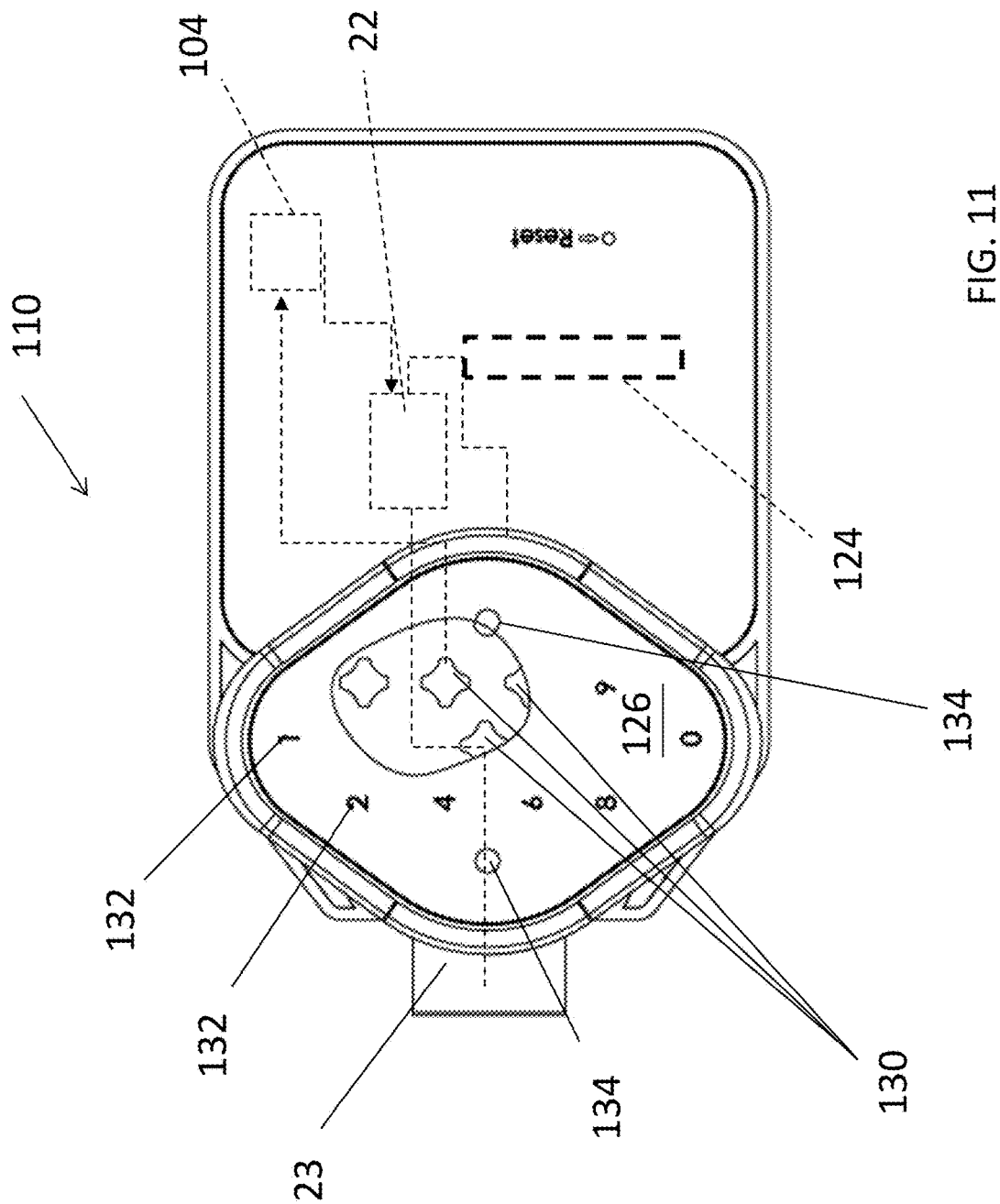
FIG. 11 is a perspective view of the lock illustrated with a portion of the photovoltaic cells removed to illustrate the buttons behind the photovoltaic cells.

FIG. 11 is a perspective view of a lock 110 with a portion of the photovoltaic cells removed to illustrate the buttons 130 behind the sheet or layer of photovoltaic cells 126 in accordance with another embodiment. In this embodiment, the sheet or layer of photovoltaic cells 126 is flexible as it has multiple buttons 130 located behind it.

FIG. 12 is a perspective view of a lock 110 with a portion of the photovoltaic cells removed to illustrate the buttons 130 behind the sheet or layer of photovoltaic cells 126 in accordance with another embodiment. In this embodiment, the sheet or layer of photovoltaic cells 126 is flexible as it has multiple buttons 130 located behind it.

Figures 6, 13:
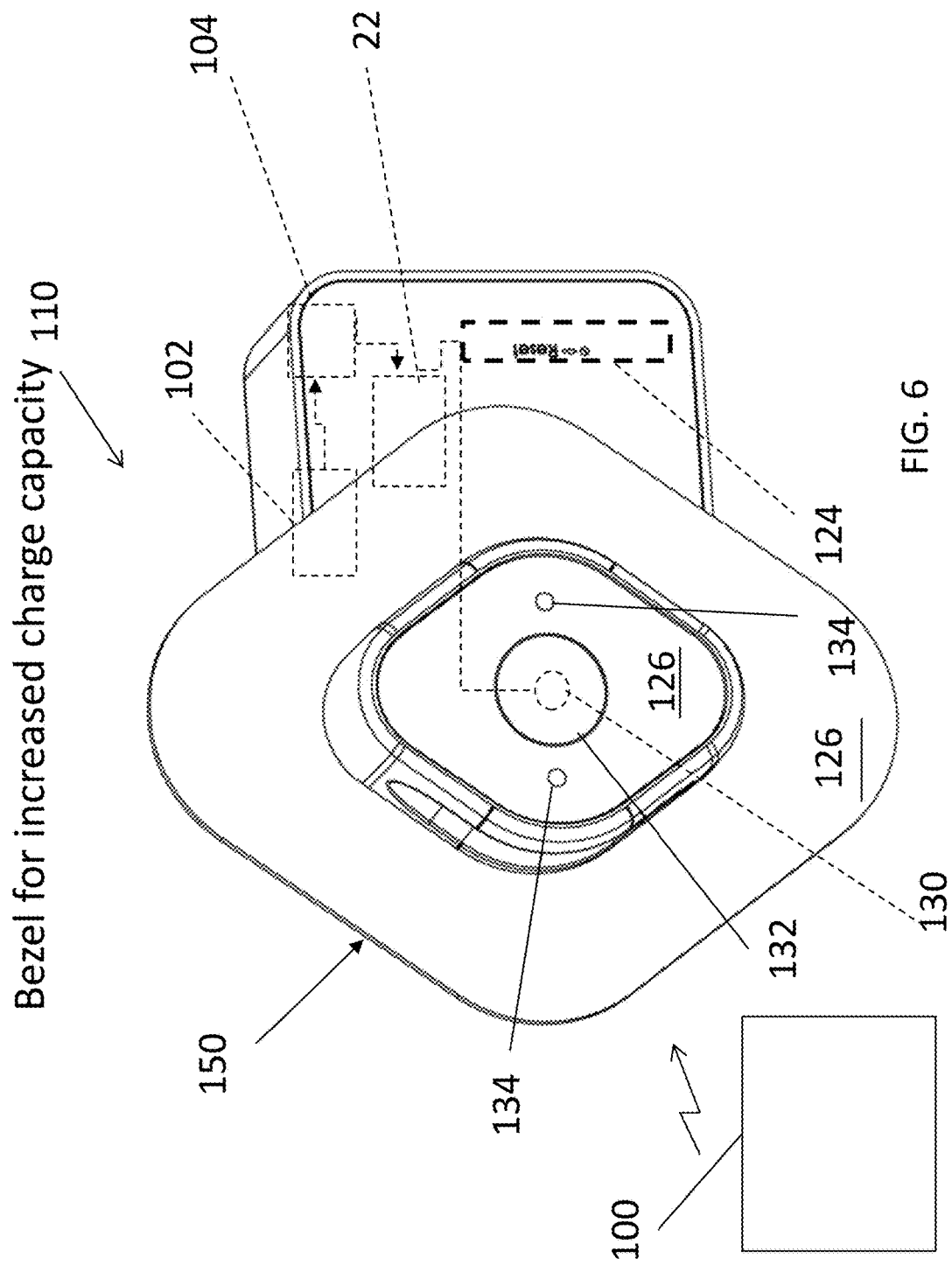
FIG. 13 is a perspective view of a lock according to the present disclosure.

FIG. 13 is a perspective view of a lock according another embodiment of the present disclosure. In this embodiment, the lock 110 has an enlarged flange or bezel 150 which increases the surface area upon which the sheet or layer of photovoltaic cells 126 can be applied in addition to the sheet or layer of photovoltaic cells 126 located over the button 30 or buttons 30. While FIG. 13 illustrates an embodiment similar to FIGS. 6 and 7, the enlarged flange or bezel 150 with the sheet or layer of photovoltaic cells 126 may be used with any of the embodiments disclosed herein.

FIG. 14 is a cross-sectional view of a portion of a lock 110 according to the present disclosure where a single button 130 is employed which is similar to the embodiments illustrated in at least FIGS. 6-8 and 13. FIG. 14 illustrates the button 130, a printed circuit board 152 and the sheet or layer of photovoltaic cells 126.

FIG. 15 is a cross-sectional view of a portion of a lock according to the present disclosure where multiple buttons 130 are employed which is similar to the embodiments illustrated in at least FIGS. 9-12. FIG. 14 illustrates the buttons 130, a printed circuit board 152 and the sheet or layer of photovoltaic cells 126.

It being understood that the sheet or layer of photovoltaic cells 126 located over the button or buttons 130 in any of the embodiments disclosed herein is moveably secured to a face of the lock 110 such that the sheet or layer of photovoltaic cells 126 which is rigid or flexible depending on the embodiment can move such that the button 130 can be actuated.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic lock, the electronic lock having an electronic drive operably coupled to a bolt for retaining a moveable member of an enclosure to a fixed body of the enclosure, the electronic lock comprising:
   a power storage device for providing electrical current to the electronic lock;
   photovoltaic cells located on an external surface of the electronic lock, the photovoltaic cells being electrically coupled to the power storage device in order to provide a charging current to the power storage device; and
   at least one button located behind and in operable contact with the photovoltaic cells such that when the photovoltaic cells are pressed by a user, and thereby depressed, then the at least one button is caused to be depressed and actuated for operating the electronic lock.

2. The electronic lock as in claim 1, wherein the power storage device is a rechargeable battery or capacitor.

3. The electronic lock as in claim 1, wherein the photovoltaic cells is a rigid sheet of photovoltaic cells.

4. The electronic lock as in claim 1, wherein the photovoltaic cells is a flexible sheet of photovoltaic cells.

5. The electronic lock as in claim 1, wherein the at least one button is a plurality of buttons.

6. The electronic lock as in claim 1, wherein the at least one button is a single button.

7. The electronic lock as in claim 1, wherein the photovoltaic cells is a rigid sheet of photovoltaic cells with indicia located on a surface of the rigid sheet of photovoltaic cells, the indicia being located over the at least one button.

8. The electronic lock as in claim 1, wherein the photovoltaic cells is a flexible sheet of photovoltaic cells with indicia located on a surface of the flexible sheet of photovoltaic cells, the indicia being located over the at least one button.

9. The electronic lock as in claim 1, further comprising the electronic drive being a motor operably coupled to the bolt of the electronic lock and the motor is energized via wireless communication with a device that communicates wirelessly with a receiver or receiver/transmitter in operable communication with a microprocessor, wherein when the device is within range of the receiver or receiver/transmitter a transmitter of the device provides an actuation code to the motor and the motor is actuated in order to retract the bolt in order to allow for the lock to open.

10. The electronic lock as in claim 9, wherein the electronic lock is in a sleep mode where the receiver/transmitter is not activated until the at least one button located behind the photovoltaic cells is depressed.

11. The electronic lock as in claim 7, wherein the indicia is a circle or a number.

12. The electronic lock as in claim 8, wherein the indicia is a circle or a number.

13. The electronic lock as in claim 1, further comprising an indicator light that illuminates when the electronic lock is activated.

14. The electronic lock as in claim 1, wherein no indicia is provided on the photovoltaic cells.

15. The electronic lock as in claim 1, wherein the at least one button is a plurality of buttons for entering a combination.

16. The electronic lock as in claim 1, further comprising a flange that surrounds a portion of the electronic lock and the photovoltaic cells are applied to the flange.

17. The electronic lock as in claim 10, further comprising an indicator light that illuminates when the electronic lock is activated.

18. The electronic lock as in claim 10, wherein no indicia is provided on the photovoltaic cells.

19. The electronic lock as in claim 18, wherein the power storage device is a rechargeable battery or capacitor.

20. The electronic lock as in claim 19, wherein the photovoltaic cells is a rigid sheet of photovoltaic cells with indicia located on a surface of the rigid sheet of photovoltaic cells, the indicia being located over the at least one button.

* * * * *